US008717221B2

(12) United States Patent
Jeon et al.

(10) Patent No.: US 8,717,221 B2
(45) Date of Patent: May 6, 2014

(54) SUCCESSIVE APPROXIMATION REGISTER ANALOG-TO-DIGITAL CONVERTER

(71) Applicant: Electronics and Telecommunications Research Institute, Daejeon (KR)

(72) Inventors: Young-deuk Jeon, Daejeon (KR); Tae Moon Roh, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/763,532

(22) Filed: Feb. 8, 2013

(65) Prior Publication Data

US 2014/0085122 A1 Mar. 27, 2014

(30) Foreign Application Priority Data

Sep. 27, 2012 (KR) ........................ 10-2012-0108120

(51) Int. Cl.
*H03M 1/38* (2006.01)
(52) U.S. Cl.
USPC .......................................... 341/172; 341/163

(58) Field of Classification Search
USPC .......................................... 341/161–163, 172
See application file for complete search history.

(56) References Cited

U.S. PATENT DOCUMENTS

| 4,803,462 | A  | * | 2/1989 | Hester et al. .................. 341/172 |
| 6,667,707 | B2 | * | 12/2003 | Mueck et al. ................. 341/172 |
| 7,432,844 | B2 | * | 10/2008 | Mueck et al. ................. 341/163 |
| 7,796,079 | B2 |   | 9/2010 | Khanna et al. |

* cited by examiner

*Primary Examiner* — Howard Williams

(57) ABSTRACT

A successive approximation register analog-to-digital converter is provided which includes first and second capacitor arrays configured to generate first and second level voltages, respectively; a comparator configured to compare the first and second level voltages to output a comparison signal; SAR logic configured to generate a digital signal in response to the comparison signal; and a variable common mode selector configured to compare a first analog input voltage and a common mode voltage and to supply one of the first analog input voltage and the common mode voltage to top plates of the first and second capacitor arrays according to a comparison result.

9 Claims, 5 Drawing Sheets

SUCCESSIVE APPROXIMATION REGISTER ANALOG-TO-DIGITAL CONVERTER

CROSS-REFERENCE TO RELATED APPLICATIONS

A claim for priority under 35 U.S.C. §119 is made to Korean Patent Application No. 10-2012-0108120 filed Sep. 27, 2012, in the Korean Intellectual Property Office, the entire contents of which are hereby incorporated by reference.

BACKGROUND

The inventive concepts described herein relate to an analog-to-digital converter, and more particularly, relate to a successive approximation register analog-to-digital converter.

An analog-to-digital converter may convert an analog signal into a digital signal. The converted digital signal may be transferred to other devices. A successive approximation register analog-to-digital converter (SAR-ADC) may have such a structure that one comparator is iteratively used, and may be simple in structure in that it does not include analog circuits such as a sample and hold circuit, a multiplying digital-to-analog converter (MDAC), and so on. Compared with other analog-to-digital converters, an area and power consumption of the successive approximation register analog-to-digital converter may be less. Also, the successive approximation register analog-to-digital converter may be easily applied to a low-voltage circuit.

The successive approximation register analog-to-digital converter may receive output signals of sensors to convert them into digital signals. General sensors may have single-voltage outputs. The successive approximation register analog-to-digital converter may have a single-ended input structure to convert an output signal of a sensor into a digital signal. The successive approximation register analog-to-digital converter may include SAR logic, a comparator, and a digital-to-analog converter. A differential amplifier may be used as a comparator to compare an output of a capacitive digital-to-analog converter. In this case, the successive approximation register analog-to-digital converter may perform a converting operation in a manner where an analog input voltage sampled by a capacitor is compared with level voltages generated based on a digital bit. In the case that an output range of a sensor having a single voltage output is a range (0 to Vdd) of a power supply voltage, a voltage of a node connected to a top plate of a capacitor may become higher than the power supply voltage Vdd. In this case, charge stored at a capacitor may be lost by malfunction of switches connected with a node having a voltage higher than the power supply voltage Vdd, so that the reliability of the successive approximation register analog-to-digital converter is lowered.

SUMMARY

One aspect of embodiments of the inventive concept is directed to provide a successive approximation register analog-to-digital converter comprising first and second capacitor arrays configured to generate first and second level voltages, respectively; a comparator configured to compare the first and second level voltages to output a comparison signal; SAR logic configured to generate a digital signal in response to the comparison signal; and a variable common mode selector configured to compare a first analog input voltage and a common mode voltage and to supply one of the first analog input voltage and the common mode voltage to top plates of the first and second capacitor arrays according to a comparison result.

In example embodiments, the first capacitor array samples the first analog input voltage and the second capacitor array samples a second analog input voltage, the first analog input voltage being included in a power supply voltage range and the second analog input voltage being half a power supply voltage.

In example embodiments, the variable common mode selector comprises a comparator configured to compare the first analog input voltage and the common mode voltage; and switches configured to select one of the first analog input voltage and the common mode voltage according to an output of the comparator.

In example embodiments, the variable common mode selector provides the top plates of the first and second capacitor arrays with the first analog input voltage when the first analog input voltage is higher than the common mode voltage and with the common mode voltage when the first analog input voltage is lower than the common mode voltage.

In example embodiments, the successive approximation register analog-to-digital converter further comprises a clock generator configured to generate a sampling clock and a conversion clock, and the first and second capacitor arrays sample the first and a second analog input voltage in response to the sampling clock and output the first and second level voltages in response to the conversion clock.

In example embodiments, the SAR logic responds to the conversion clock to decide a digital signal based on an output of the comparator.

In example embodiments, the variable common mode selector selects one of the first analog input voltage and the common mode voltage in response to the sampling clock to be supplied to the top plates of the first and second capacitor arrays.

In example embodiments, one of first and second reference voltages is supplied to bottom plates of the first and second capacitor arrays based on the digital signal.

In example embodiments, the common mode voltage is half a power supply voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
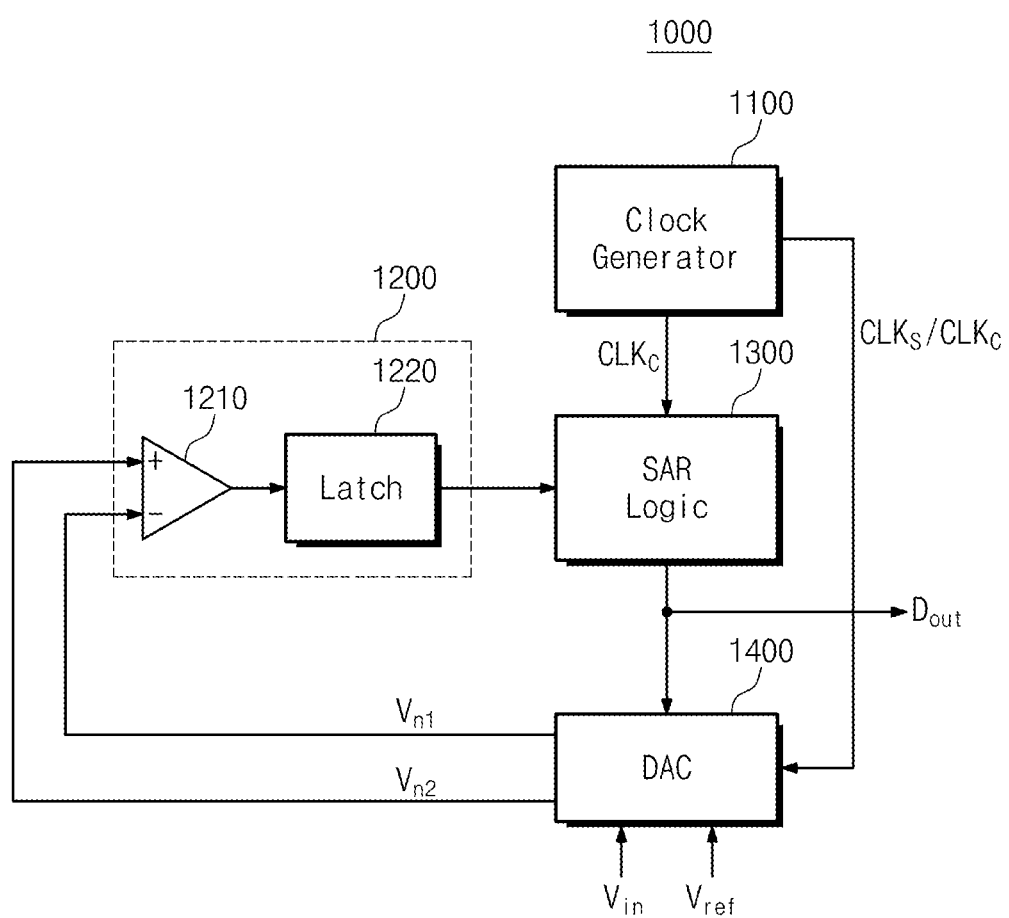
FIG. 1 is a block diagram schematically illustrating a successive approximation register analog-to-digital converter.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a successive approximation register analog-to-digital converter. In example embodiments, first and second input voltages Vin1 and Vin2 may be generated based on an analog input voltage Vin. A differential component between the first and second analog input voltages Vin1 and Vin2 may be the analog input voltage Vin. The first analog input voltage Vin1 may be higher than the second analog input voltage Vin2. In example embodiments, first and second reference voltages Vref1 and Vref2 may be generated on the basis of a reference voltage Vref. A differential component between the first and second reference voltages Vref1 and Vref2 may be the reference voltage Vref. The first reference voltage Vref1 may be higher than the second reference voltage Vref2.

Referring to FIG. 1, a successive approximation register analog-to-digital converter (hereinafter, referred to as SAR ADC) may include a clock generator 1100, a comparator 1200, SAR logic 1300, and a digital-to-analog converter 1400 (hereinafter, referred to as DAC).

The clock generator 1100 may generate a sampling clock CLKs and a conversion clock CLKc. The sampling clock CLKs and the conversion clock CLKc may be complementary. The sampling clock CLKs may be transferred to the DAC 1400, and the conversion clock CLKc may be transferred to the SAR logic 1300 and the DAC 1400. In example embodiments, the DAC 1400 may sample the input voltage Vin in response to the sampling clock CLKs. The DAC 1400 may generate first and second level voltages Vn1 and Vn2 in response to the conversion clock CLKc.

The comparator 1200 may compare the first and second level voltages Vn1 and Vn2. The comparator 1200 may include a differential pre-amplifier 1210 and a latch 1220. The differential pre-amplifier 1210 may compare the first and second level voltages Vn1 and Vn2 to amplify a comparison result. In example embodiments, the differential pre-amplifier 1210 may have one of an NMOS input terminal and a PMOS input terminal.

The latch 1220 may store data '0' or data '1' based on an output of the differential pre-amplifier 1210. For example, when the first level voltage Vn1 is higher than the second level voltage Vn2, the latch 1220 may store data '1'. When the first level voltage Vn1 is lower than the second level voltage Vn2, the latch 1220 may store data '0'.

The SAR logic 1300 may operate responsive to the conversion clock CLKc, and may decide a digital bit based on data stored at the latch 1220. For example, the SAR logic 1300 may convert the analog input voltage Vin into a 3-bit digital signal. At an initial converting operation, digital signals of the SAR logic 1300 may be reset to be logically low. All capacitors (refer to FIG. 2) may be connected to a common mode voltage $V_{CM}$ by decoding logic (refer to FIG. 2) included in the DAC 1400. Afterwards, the comparator 1200 may decide a most significant bit MSB to store the MSB at the latch 1220. The SAR logic 1300 may decide the MSB based on data stored at the latch 1220 in response to the conversion clock CLKc. In a case where data '1' is stored at the latch 1220, the SAR logic may decide the MSB to be logically high. In a case where data '0' is stored at the latch 1220, the SAR logic may decide the MSB to be logically low.

Figure 2:
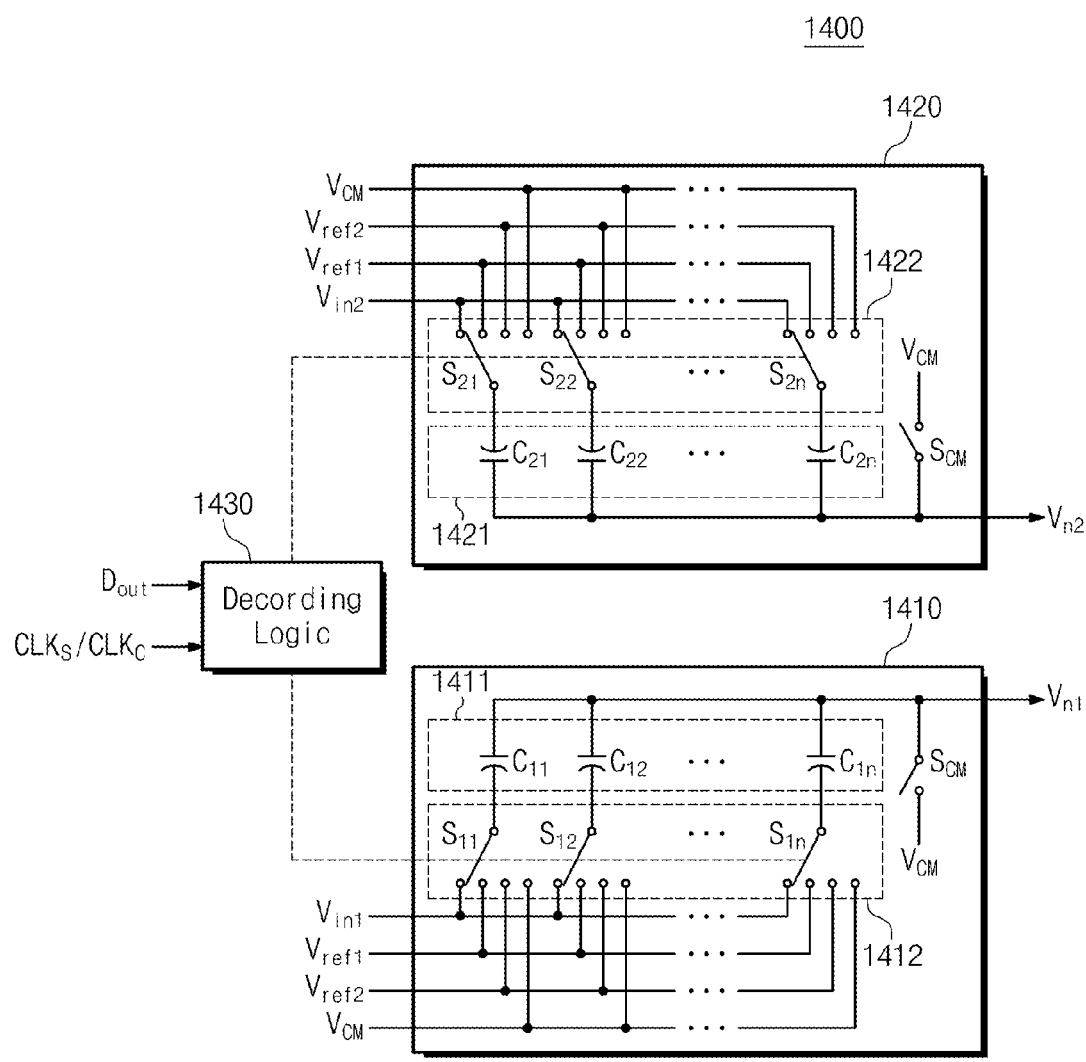
FIG. 2 is a detailed circuit diagram illustrating a digital-to-analog converter of FIG. 1.

After deciding the MSB, the SAR logic 1300 may transfer the MSB to the decoding logic (refer to FIG. 2). Afterwards, the SAR logic 1300 may decide a least significant bit LSB through iteration of the above-described operation.

The DAC 1400 may output the first and second level voltages Vn1 and Vn2 based on the analog input voltage Vin, the reference voltage Vref, and a digital signal received from the SAR logic 1300. For example, a differential component between the first and second analog input voltages Vin1 and Vin2 may be the analog input voltage Vin. In response to the sampling clock CLKs, the DAC 1400 may sample the first and second analog input voltages Vin1 and Vin2. In response to the conversion clock CLKc, the DAC 1400 may generate the first and second level voltages Vn1 and Vn2. A level voltage may be a value for deciding a level of the analog input voltage Vin, and may be obtained by dividing the reference voltage Vref appropriately based on a digital resolution of an analog-to-digital converter. In example embodiments, the DAC 1400 may be a capacitive DAC which operates according to a charge redistribution manner.

FIG. 2 is a detailed circuit diagram illustrating a DAC of FIG. 1. In example embodiments, a differential component between the first and second analog input voltages Vin1 and Vin2 may be an analog input voltage Vin. For ease of description, an operation of a DAC 1400 will be described using an MSB deciding procedure. An SAR ADC 1000 may decide remaining digital signals based on iteration of the MSB deciding procedure. It is assumed that top plates of first and second capacitor arrays 1411 and 1421 indicate a surface where the first and second capacitor arrays 1411 and 1421 are connected with nodes from which first and second level voltages Vn1 and Vn2 are output. Also, it is assumed that bottom plates of the first and second capacitor arrays 1411 and 1421 indicate a surface of the first and second capacitor arrays 1411 and 1421 connected with first and second switch arrays 1412 and 1422.

Referring to FIGS. 1 and 2, a DAC 1400 may include a first conversion unit 1410, a second conversion unit 1420, and a decoding logic 1430. The first conversion unit 1410 may generate a first level voltage Vn1. The first conversion unit 1410 may include a first capacitor array 1411, a first switch array 1412, and a common mode switch $S_{CM}$. The first capacitor array 1411 may include a plurality of capacitors $C_{11}$ to $C_{1n}$. The number of the capacitors $C_{11}$ to $C_{1n}$ may be decided according to a digital resolution of the SAR ADC 1000. For example, in the case that the SAR DAC 1000 has a 3-bit digital resolution, the first capacitor array 1411 may include three capacitors having different capacitances. In example embodiments, the first conversion unit 1410 may generate the first level voltage Vn1 based on a charge redistribution manner.

The first switch array 1412 may include a plurality of switches $S_{11}$ to $S_{1n}$. The first switch array 1411 may supply one of first and second reference voltages Vref1 and Vref2 and a common mode voltage $V_{CM}$ to bottom plates of the first capacitor array 1411 according to a control of the decoding logic 1430. In example embodiments, the common mode voltage VCM may be a half of a power supply voltage (Vdd/2).

The decoding logic 1430 may receive a digital signal Dout from SAR logic 1300. The decoding logic 1430 may receive a sampling clock CLKs and a conversion clock CLKc. The decoding logic 1430 may control the switches $S_{11}$ to $S_{1n}$ of the first switch array 1412 in response to the sampling clock CLKs such that the first analog input voltage Vin1 is supplied to the bottom plates of the first capacitor array 1411. The decoding logic 1430 may selectively control the switches $S_{11}$ to $S_{1n}$ of the first switch array 1412 in response to the conversion clock CLKc such that one of the first and second analog input voltages Vin1 and Vin2 and the common mode voltage $V_{CM}$ is supplied to the bottom plates of the first capacitor array 1411. For example, a most significant bit MSB of the digital signal Dout received at an MSB deciding operation may be logically high. In this case, the decoding logic 1430 may control a first switch $S_{11}$ in response to the conversion clock CLKc such that the first reference voltage Vref1 is supplied to the bottom plate of a capacitor $C_{11}$. The decoding logic 1430 may control the remaining switches $S_{12}$ to $S_{1n}$ such that the common mode voltage $V_{CM}$ is supplied to the bottom plates of the remaining capacitors $C_{12}$ to $C_{1n}$.

The common mode switch $S_{CM}$ may be connected such that the common mode voltage $V_{CM}$ is supplied to the top plates of the first capacitor array 1411 according to the sampling clock CLKs.

The second conversion unit 1420 may include a second capacitor array 1421, a second switch array 1422, and a common mode switch $S_{CM}$. An operation of the second conversion unit 1420 may be similar to that of the first conversion unit 1410, and may output a second level voltage Vn2. The second conversion unit 1420 may operate in a differential mode in comparison with the first conversion unit 1420. For example, the second capacitor array 1421 may sample a second analog input signal Vin2 in response to a control of the decoding logic 1430. The second switch array 1422 may operate responsive to a control of the decoding logic 1430. A most significant bit MSB of the digital signal Dout received at an MSB deciding operation may be logically high. The decoding logic 1430 may control a switch $S_{21}$ such that the second reference voltage Vref2 is supplied to the bottom plate of a capacitor $C_{21}$. The decoding logic 1430 may control the remaining switches $S_{22}$ to $S_{2n}$ such that the common mode voltage $V_{CM}$ is supplied to the bottom plates of the remaining capacitors $C_{22}$ to $C_{2n}$.

The first and second level voltages Vn1 and Vn2 may be transferred to a comparator 1200.

With the DAC 1400, the first and second capacitor arrays 1411 and 1421 may sample the first and second analog input voltages Vin1 and Vin2 in response to the sampling clock CLKs, respectively. The first and second conversion units 1410 and 1420 may generate the first and second level voltages Vn1 and Vn2 based on the first and second analog input voltages Vin1 and Vin2, respectively. SAR logic 1300 may decide a digital value based on a difference between the first and second analog input voltages Vin1 and Vin2. The SAR DAC 1000 may convert an analog input voltage Vin into a digital signal Dout through iteration of the above-described operation.

Figure 3:
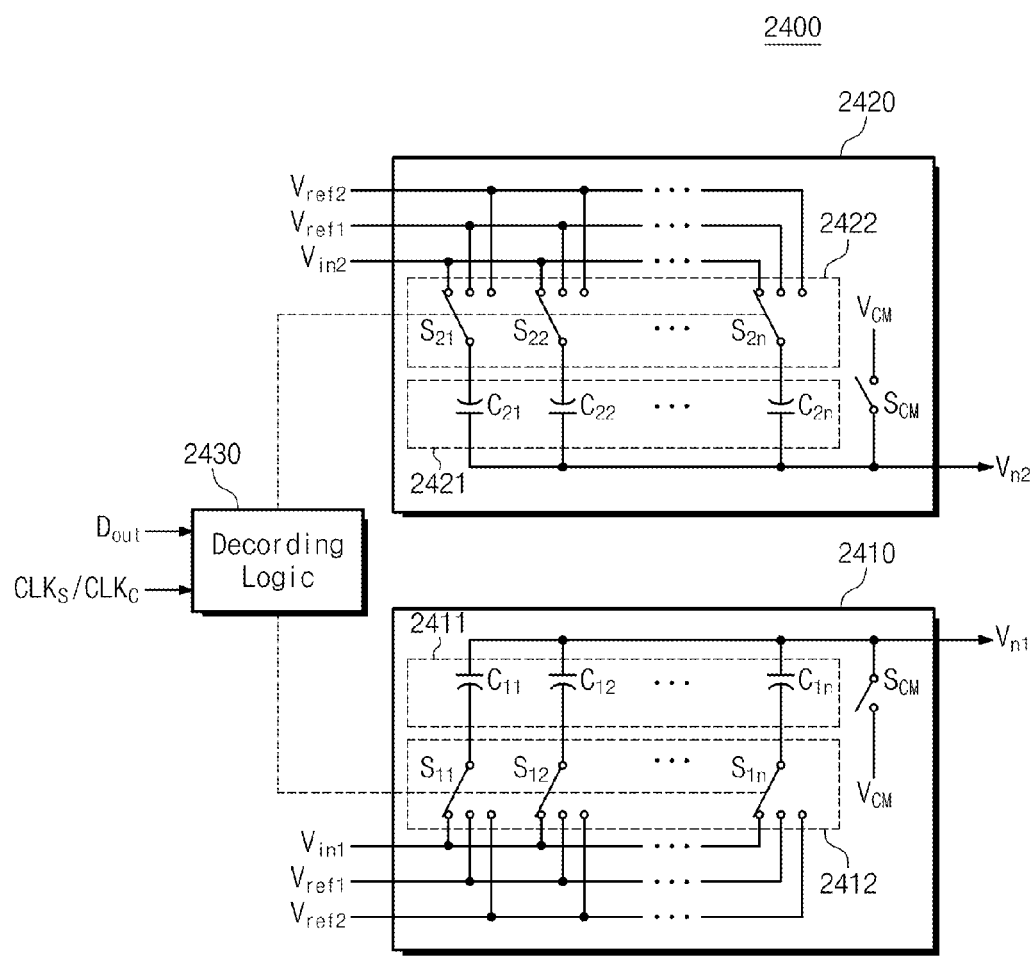
FIG. 3 is a circuit diagram illustrating another embodiment of a digital-to-analog converter of FIG. 1.

FIG. 3 is a circuit diagram illustrating a DAC according to another embodiment of the inventive concept. Configuration and operation of a DAC 2400 of FIG. 3 may be similar to configuration and operation of a DAC 1400 of FIG. 2. Thus, a difference between the DAC 1400 and the DAC 2400 will be mainly described.

Referring to FIG. 3, the DAC 2400 may include a first conversion unit 2410, a second conversion unit 2420, and decoding logic 2430. In comparison with a first conversion unit 1410 of FIG. 2, the first conversion unit 2410 may supply one of first and second reference voltages Vref1 and Vref2 through a first switch array 2412. That is, the first switch array 2412 may not be connected with a common mode voltage $V_{CM}$.

One of the first and second reference voltages Vref1 and Vref2 may be used as a common mode voltage $V_{CM}$ to be supplied to bottom plates of first and second capacitor arrays 2411 and 2421. In the case that an input terminal of a differential pre-amplifier 1210 (refer to FIG. 1) receiving first and second level voltages Vn1 and Vn2 is an NMOS transistor, the first reference voltage Vref1 may be connected with bottom plates of capacitors instead of the common mode voltage $V_{CM}$ supplied to bottom plates of capacitors (refer to FIG. 2). On the other hand, in the case that the input terminal of the differential pre-amplifier 1210 is a PMOS transistor, the second reference voltage Vref2 may be connected with the bottom plates of the capacitors instead of the common mode voltage $V_{CM}$. In example embodiments, operations of the DAC 2400 of FIG. 3 may be the same as operations of the DAC 1400 except the above-described difference.

In example embodiments, the DAC 2400 may receive a single analog input voltage. In this case, a first analog input voltage Vin1 may be the same as the single analog input voltage. That is, the first analog input voltage Vin1 may be included in a power supply voltage range (0 to Vdd). The second analog input voltage Vin2 may be a half of a power supply voltage (Vdd/2). In this case, the first and second level voltages Vn1 and Vn2 may be expressed by the following equations 1 and 2. In example embodiments, the first reference voltage Vref1 may be three quarters of the power supply voltage (3Vdd/4), and the second reference voltage Vref2 may be a quarter of the power supply voltage (Vdd/4).

$$V_{n1} = \frac{V_{dd}}{2} + (V_{ref1} - V_{in1}) \quad (1)$$

$$V_{n2} = \frac{V_{dd}}{2} + \frac{V_{dd}}{4} \quad (2)$$

Referring to the equations 1 and 2, when the first analog input voltage Vin1 is 0, the first level voltage Vn1 may be:

$$\frac{5 \cdot V_{dd}}{4}$$

That is, when the DAC 2400 operates based on a single analog input voltage, the first level voltage Vn1 may be higher than the power supply voltage Vdd. In this case, the common mode switch $S_{CM}$ does not operate normally. This may cause a leakage of charge stored at the first and second capacitor arrays 2411 and 2421. Thus, the reliability of a system may be lowered.

Figure 4:
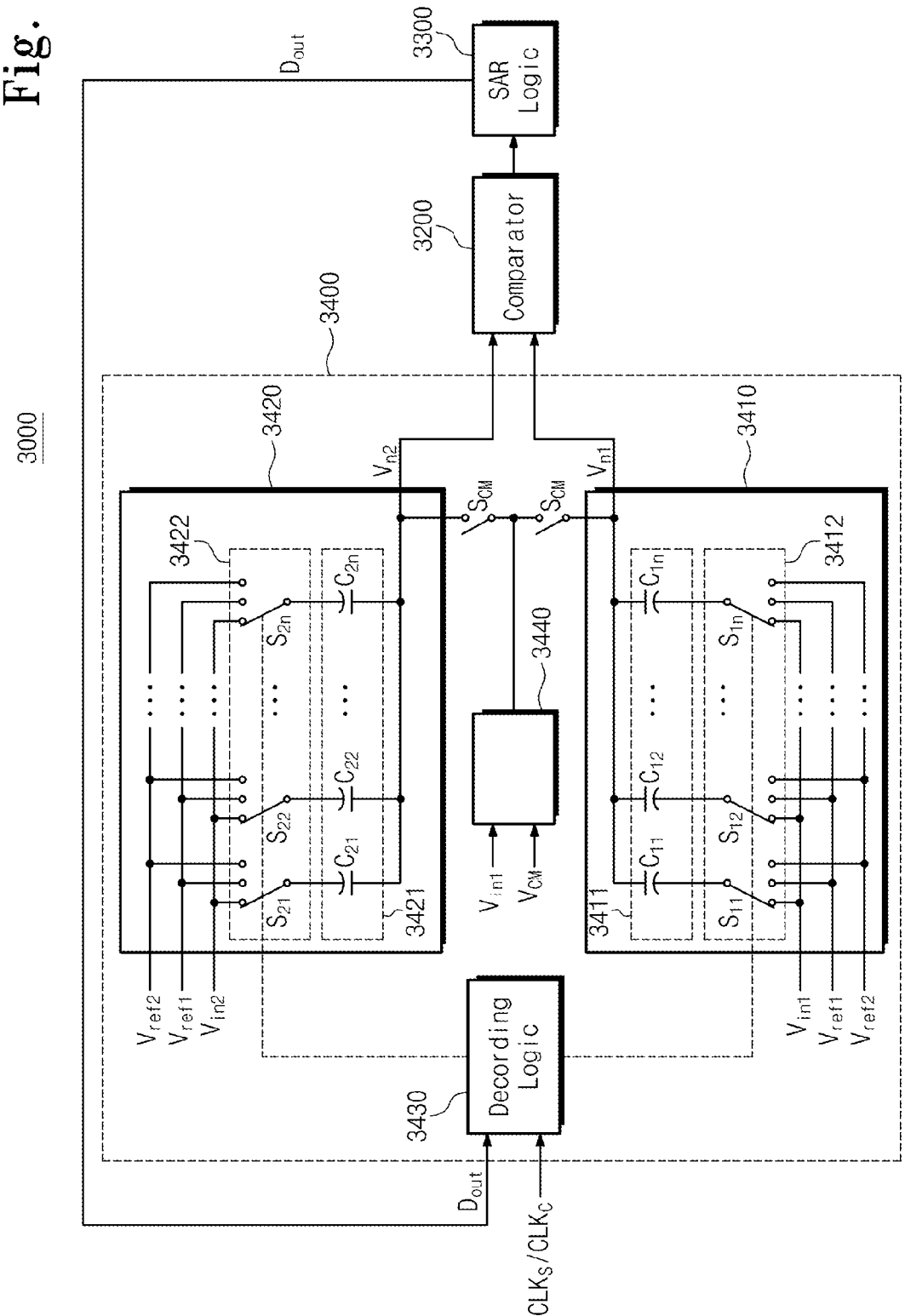
FIG. 4 is a diagram schematically illustrating a successive approximation register analog-to-digital converter according to an embodiment of the inventive concept.

FIG. 4 is a diagram schematically illustrating an SAR ADC according to an embodiment of the inventive concept. In example embodiments, a DAC 3400 may operate based on a single analog input voltage. That is, a first analog input voltage Vin1 may be included in a power supply voltage range (0V to Vdd), and the second analog input voltage Vin2 may be a half of the power supply voltage (Vdd/2). Also, first and second reference voltages Vref1 and Vref2 may be Vdd*(3/4) and Vdd*(1/4), respectively.

Referring to FIG. 4, the SAR ADC 3000 may include a comparator 3200, SAR logic 3300, and a DAC 3400. The DAC 3400 may include a first conversion unit 3410, a second conversion unit 3420, decoding logic 3430, a variable common mode selector 3440, and common mode switches $S_{CM}$. The first conversion unit 3410 may include a first capacitor array 3411 and a first switch array 3412. The second conversion unit 3420 may include a second capacitor array 3421 and a second switch array 3422. The components 3200, 3300, 3410, 3420, 3430, $S_{CM}$, 3411, 3412, 3420, 3421, and 3422 may be the same as those described with reference to FIG. 3, and a description thereof is thus omitted.

The variable common mode selector 3440 may compare a first analog input voltage Vin1 and a common mode voltage $V_{CM}$. The variable common mode selector 3440 may select one of the first analog input voltage Vin1 and the common mode voltage $V_{CM}$ according to a comparison result to supply the selected voltage to top plates of the first capacitor array 3411. For example, when the first analog input voltage Vin1 is higher than the common mode voltage $V_{CM}$, the variable common mode selector 3440 may supply the common mode voltage $V_{CM}$ to the top plates of the first capacitor array 3411. When the first analog input voltage Vin1 is lower than the common mode voltage $V_{CM}$, the variable common mode selector 3440 may supply the first analog input voltage Vin1 to the top plates of the first capacitor array 3411. In example embodiments, the variable common mode selector 3440 may supply top plates of the first and second capacitor arrays 3411 and 3421 with one of the first analog input voltage Vin1 and the common mode voltage $V_{CM}$ in response to a sampling clock CLKs.

First and second level voltages Vn1 and Vn2 of the DAC 3400 of the inventive concept may be included in a power supply voltage range (0V to Vdd). For example, referring to the equations 1 and 2, when the first analog input voltage Vin1 is lower than the common mode voltage $V_{CM}$, a maximum value of the first level voltage Vn1 may be the first reference voltage Vref1 such that the first analog input voltage Vin1 is supplied to the top plates of the first capacitor array 3411. When the first analog input voltage Vin1 is higher than the common mode voltage $V_{CM}$, a minimum value of the first level voltage Vn1 may be (Vdd/2−Vdd/4) such that the common mode voltage $V_{CM}$ is supplied to the top plates of the first capacitor array 3411. Thus, since the first level voltage Vn1 is included in the power supply voltage range, a problem described with reference to FIG. 3 may be solved. As a result, the reliability of the SAR DAC 3000 may be secured.

Figure 5:
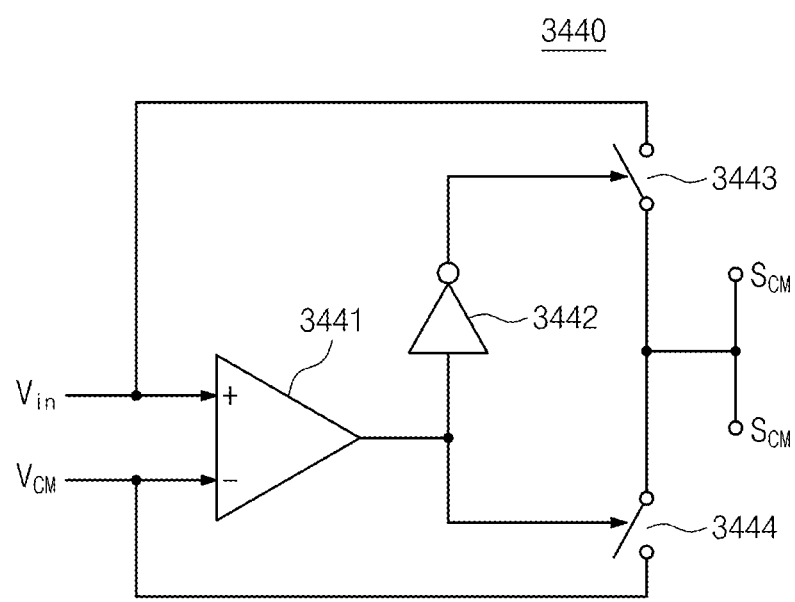
FIG. 5 is a circuit diagram schematically illustrating a variable common mode selector of FIG. 4.

FIG. 5 is a circuit diagram schematically illustrating a variable common mode selector of FIG. 4. Referring to FIG. 5, a variable common mode selector 3440 may include a comparator 3441, an inverter 3442, and switches 3443 and 3444. The comparator 3441 may compare a first analog input voltage Vin1 and a common mode voltage $V_{CM}$. The inverter 3442 may invert a comparison result of the comparator 3441. The switches 3443 and 3444 respectively may operate according to outputs of the inverter 3442 and the comparator 3441.

The variable common mode selector 3440 may compare the first analog input voltage Vin1 and the common mode voltage $V_{CM}$ to selectively output one of the first analog input voltage Vin1 and the common mode voltage $V_{CM}$. An output voltage of the variable common mode selector 3440 may be transferred to a common mode switch $S_{CM}$ illustrate in FIG. 4.

In example embodiments, when the first analog input voltage Vin1 is higher than the common mode voltage $V_{CM}$, the variable common mode selector 3440 may output the common mode voltage $V_{CM}$. When the first analog input voltage Vin1 is lower than the common mode voltage $V_{CM}$, the variable common mode selector 3440 may output the first analog input voltage Vin1.

With the inventive concept, one of an analog input voltage and a common mode voltage may be supplied to top plates of capacitor arrays according to a comparison result of the analog input voltage and the common mode voltage. Thus, first and second level voltages generated by a DAC may be included in a power supply voltage range. As a result, it is possible to provide an SAR DAC with the improved reliability.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A successive approximation register analog-to-digital converter comprising:
   first and second capacitor arrays configured to generate first and second level voltages, respectively;
   a comparator configured to compare the first and second level voltages to output a comparison signal;
   SAR logic configured to generate a digital signal in response to the comparison signal; and
   a variable common mode selector configured to compare a first analog input voltage and a common mode voltage and to supply one of the first analog input voltage and the common mode voltage to top plates of the first and second capacitor arrays according to the comparison result.

2. The successive approximation register analog-to-digital converter of claim 1, wherein the first capacitor array samples the first analog input voltage and the second capacitor array samples a second analog input voltage, the first analog input voltage being included in a power supply voltage range and the second analog input voltage being half a power supply voltage.

3. The successive approximation register analog-to-digital converter of claim 2, wherein the variable common mode selector comprises:
   a comparator configured to compare the first analog input voltage and the common mode voltage; and
   switches configured to select one of the first analog input voltage and the common mode voltage according to an output of the comparator.

4. The successive approximation register analog-to-digital converter of claim 3, wherein the variable common mode selector provides the top plates of the first and second capacitor arrays with the first analog input voltage when the first analog input voltage is higher than the common mode voltage and with the common mode voltage when the first analog input voltage is lower than the common mode voltage.

5. The successive approximation register analog-to-digital converter of claim 1, further comprising:
   a clock generator configured to generate a sampling clock and a conversion clock, and
   wherein the first and second capacitor arrays sample the first and a second analog input voltage in response to the sampling clock and output the first and second level voltages in response to the conversion clock.

6. The successive approximation register analog-to-digital converter of claim 5, wherein the SAR logic responds to the conversion clock to decide a digital signal based on an output of the comparator.

7. The successive approximation register analog-to-digital converter of claim 5, wherein the variable common mode selector selects one of the first analog input voltage and the common mode voltage in response to the sampling clock to be supplied to the top plates of the first and second capacitor arrays.

8. The successive approximation register analog-to-digital converter of claim 1, wherein one of first and second reference voltages is supplied to bottom plates of the first and second capacitor arrays based on the digital signal.

9. The successive approximation register analog-to-digital converter of claim 1, wherein the common mode voltage is half a power supply voltage.

* * * * *